(12) United States Patent
Hasegawa (10) Patent No.: US 6,618,146 B1
(45) Date of Patent: Sep. 9, 2003

(54) OSCILLATION MECHANISM IN EXPOSURE APPARATUS

(75) Inventor: Takayuki Hasegawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/670,541

(22) Filed: Sep. 27, 2000

(30) Foreign Application Priority Data

Sep. 28, 1999 (JP) .......................................... 11-273550

(51) Int. Cl.$^7$ ................................................ G01B 11/00
(52) U.S. Cl. ........................................ 356/400; 378/34
(58) Field of Search ................................ 356/400, 401

(56) References Cited

U.S. PATENT DOCUMENTS

| | | | | |
|---|---|---|---|---|
| 3,888,562 A | * | 6/1975 | Rushing et al. | 250/234 |
| 4,853,745 A | * | 8/1989 | Kamiya et al. | 356/401 |
| 5,497,231 A | * | 3/1996 | Schmidt | 356/328 |
| 5,835,560 A | | 11/1998 | Amemiya et al. | 378/34 |
| 5,930,324 A | * | 7/1999 | Matsui et al. | 378/34 |
| 6,081,581 A | * | 6/2000 | Hasegawa | 378/34 |
| 6,107,770 A | * | 8/2000 | Jackson et al. | 359/213 |
| 6,160,865 A | * | 12/2000 | Ogushi | 378/34 |
| 6,256,371 B1 | * | 7/2001 | Hasegawa et al. | 378/34 |
| 6,404,505 B2 | * | 6/2002 | Matsui | 356/400 |

FOREIGN PATENT DOCUMENTS

JP          7-321007          12/1995

* cited by examiner

Primary Examiner—John R. Lee
Assistant Examiner—Johnnie L Smith, II
(74) Attorney, Agent, or Firm—Fitzpatrick, Cella, Harper & Scinto (57) ABSTRACT

An oscillation mechanism includes a measuring device for measuring a position of an object, a movable stage being arranged so as to be positioned with respect to the object, a driving mechanism for moving the stage, a control unit for controlling the driving mechanism on the basis of an output of the measuring device, an oscillation element mounted on the stage, which is arranged to be oscillated with respect to the stage, and an intermediate element having a predetermined mass, which is disposed between the stage and the oscillation element. The intermediate element is (i) connected to the oscillation element through a first spring element having a predetermined spring constant, and (ii) connected to the stage through a second spring element having a predetermined spring constant. The oscillation mechanism also includes an oscillation unit for oscillating the oscillation element by oscillating the intermediate element at a predetermined frequency.

14 Claims, 4 Drawing Sheets

OSCILLATION MECHANISM IN EXPOSURE APPARATUS

FIELD OF THE INVENTION AND RELATED ART

This invention relates to an oscillation mechanism for producing high-frequency oscillation upon a stage being positioned very precisely. In another aspect, the invention concerns an exposure apparatus having such an oscillation mechanism and/or a device manufacturing method using the same.

In exposure apparatuses, for the manufacture of a very fine pattern such as a circuit pattern of a semiconductor device, further decreases in linewidth of a transferred pattern and further increases of throughput are desired. For a narrowed linewidth of a transferred pattern, the wavelength of exposure light to be used for an exposure process should be shortened more, and the wavelength shortening has been made by using g-line light, i-line light, KrF laser light and so on. As regards synchrotron radiation light emitted from a synchrotron ring, because the wavelength thereof is short, it has an advantage in transferring a very fine pattern and attracts much attention as exposure light in an exposure apparatus.

The synchrotron radiation light emitted from a synchrotron ring comprises a sheet-like beam having a small thickness in a vertical direction. Proposals have been made in relation to it, to oscillatingly move an X-ray mirror for reflecting and directing the sheet-like synchrotron radiation beam to an exposure region, so as to scanningly deflect the beam upon the exposure region thereby to substantively expand the beam irradiation region with respect to the vertical direction.

Figure 4:
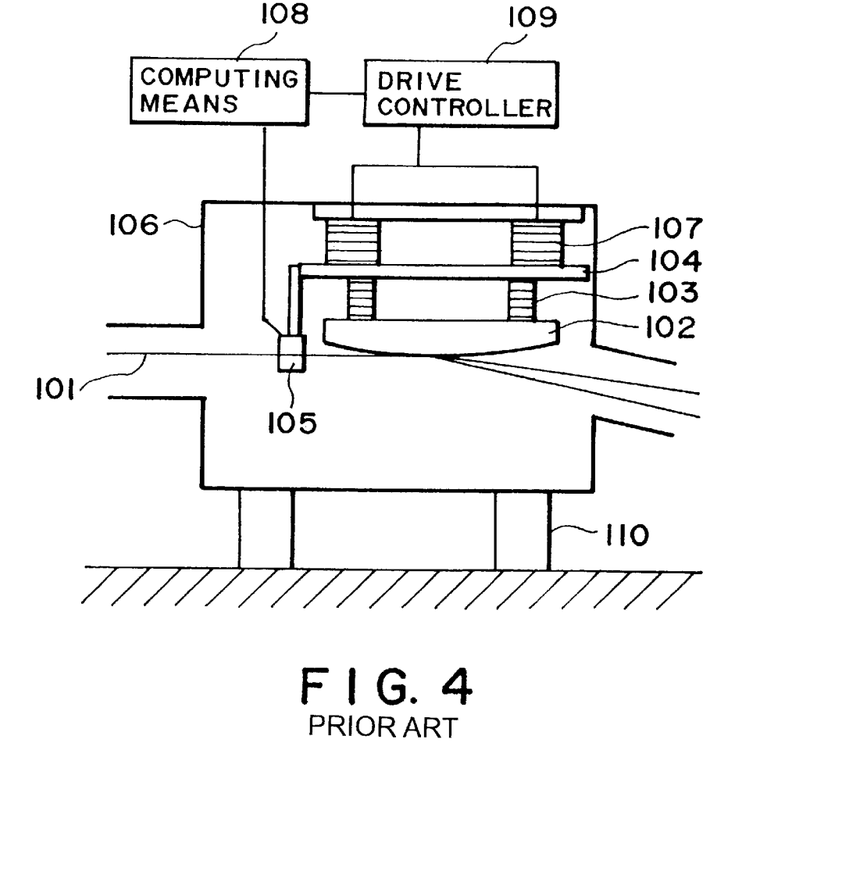
FIG. 4 is a schematic view of a conventional exposure apparatus.

An example of such an X-ray exposure apparatus is disclosed in Japanese Laid-Open Patent Application, Laid-Open No. 321007/1995. FIG. 4 shows such an exposure apparatus, wherein denoted at 101 is synchrotron radiation light (hereinafter, "SR beam") emitted from a synchrotron ring, not shown. Denoted at 102 is an X-ray mirror for reflecting the SR beam 101, and denoted at 103 is an oscillation mechanism for oscillating the X-ray mirror 102. Denoted at 104 is a reference stage for holding the X-ray mirror 102 and the oscillation mechanism 103, and denoted at 105 is an X-ray position detector for detecting the position of the SR beam 101, wherein the detector 105 is mounted on the reference stage 104. Denoted at 106 is a mirror chamber for accommodating therein the X-ray mirror 102, the oscillation mechanism 103, the reference stage 104 and the like, and the inside space of the mirror chamber is kept at an ultra-high vacuum. Denoted at 107 is a driving mechanism for adjusting the position and posture of the reference stage 104, and denoted at 108 is a computing unit for processing an output signal of the X-ray position detector 105 to calculate the position of the SR beam 101. Denoted at 109 is a drive control mechanism for actuating the driving mechanism 107 in response to a signal from the computing unit 108. Denoted at 110 is a chamber holding unit for securing the mirror chamber 106 on a floor.

In the X-ray exposure apparatus with the structure described above, the position of the SR beam 101 is detected by the X-ray position detector 105. Then, by using the computing unit 108, the drive control mechanism 109 and the driving mechanism 107, the X-ray mirror 102 is positioned with respect to the SR beam 101. While keeping that position, the X-ray mirror 102 is oscillated by the oscillation mechanism 103 with a predetermined amplitude. With this oscillation of the X-ray mirror 102, the SR beam of sheet-like shape is scanningly deflected along the exposure region, whereby the beam irradiation region is substantively expanded.

However, the oscillation mechanism such as described above and incorporated into an exposure apparatus involves inconveniences as follows.

If, for example, an oscillation element such as an X-ray mirror is bulky or if the frequency or amplitude of oscillation is large, a large oscillation force is required to produce oscillation of the oscillation element (X-ray mirror) at the predetermined frequency or amplitude. This necessarily cause a large reaction force which is transmitted from the oscillation mechanism to the reference stage for holding the oscillation mechanism. This means a large external disturbance to the reference stage, which causes degradation of the controllability of the reference stage position and thus, degradation of the positioning precision of the SR beam with respect to its positioning reference, for example.

Figure 3:
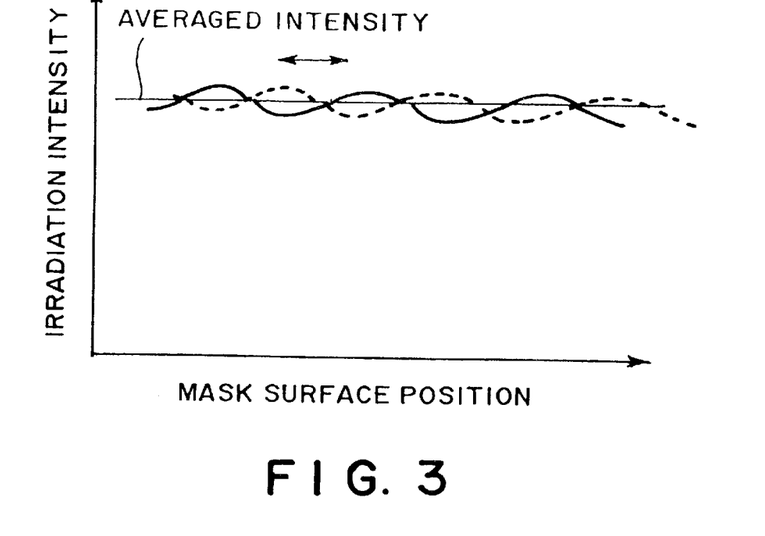
FIG. 3 is a graph for explaining a process for averaging non-uniformness of an SR beam irradiation intensity on a mask surface in an exposure apparatus.

Particularly, in the exposure apparatus as shown in FIG. 4 and in a case where the SR beam 101 is substantively expanded by the X-ray mirror 102 to irradiate the whole mask surface at once (whole surface exposure), if there is an error in shape of the mirror reflection surface or non-uniformness of reflection factor thereof, it directly causes non-uniformness of the intensity of the SR beam projected on the mask surface. In order to average such non-uniformness, it would be necessary to produce high-speed micro-vibration of the X-ray mirror to cause averaging of the SR beam irradiation intensity on the mask surface, as illustrated in FIG. 3. However, if high-speed micro-vibration of the X-ray mirror 102 is produced, it causes vibration of the reference stage 104, holding the X-ray mirror 102 and the oscillation mechanism 103, due to external disturbance. This results in degradation of the positioning precision of the X-ray mirror 102 with respect to the SR beam 101. Uniform irradiation intensity of the SR beam upon the mask surface is therefore unattainable.

SUMMARY OF THE INVENTION

It is accordingly an object of the present invention to provide an oscillation mechanism by which the positioning precision with respect to a certain positioning reference is not degraded even if an oscillation element such as an X-ray mirror is oscillated or vibrated with a predetermined frequency and/or a predetermined amplitude.

It is another object of the present invention to provide an exposure apparatus with such an oscillation mechanism incorporated thereon, by which an X-ray mirror is oscillated or vibrated with a result of uniform SR beam irradiation intensity on a mask surface.

It is a further object of the present invention to provide a device manufacturing method using such an exposure apparatus.

In accordance with an aspect of the present invention, there is provided an oscillation mechanism, comprising: a measuring device for measuring a position of an object; a movable stage being arranged so as to be positioned with respect to the object; a driving mechanism for moving said stage; a control unit for controlling said driving mechanism on the basis of an output of said measuring device; an oscillation element mounted on said stage and being arranged to be oscillated at a predetermined stroke; an intermediate structure having a predetermined mass and being disposed between said stage and said oscillation element; a spring element for coupling said intermediate structure, said stage and said oscillation element with each other; and an oscillating unit for oscillating said oscillation element at a predetermined frequency.

The oscillating unit may be operable to change the oscillating frequency continuously.

The oscillating frequency of said oscillating unit may be changed continuously to determine an oscillating frequency with which vibration to be applied to said stage is minimized.

The oscillating unit may include a piezoelectric device.

In accordance with another aspect of the present invention, there is provided an exposure apparatus, comprising: a light source; a measuring device for measuring a beam from said light source; a movable stage being arranged so as to be positioned with respect to the beam; a driving mechanism for moving said stage; a control unit for controlling said driving mechanism on the basis of an output of said measuring device; an oscillation element mounted on said stage and being arranged to be oscillated at a predetermined stroke, said oscillation element holding an optical element; an intermediate structure having a predetermined mass and being disposed between said stage and said oscillation element; a spring element for coupling said intermediate structure, said stage and said oscillation element with each other; and an oscillating unit for oscillating said oscillation element at a predetermined frequency.

The light source may comprise a synchrotron radiation light source.

The optical element may comprise a mirror.

The oscillating unit may be operable to change the oscillating frequency continuously.

The oscillating frequency of said oscillating unit may be changed continuously to determine an oscillating frequency with which vibration to be applied to said stage is minimized.

The oscillating unit may include a piezoelectric device.

In accordance with a further aspect of the present invention, there is provided a device manufacturing method, comprising the steps of: applying a photosensitive material to a wafer; exposing the wafer by use of an exposure apparatus as recited above; and developing the exposed wafer.

In an oscillation mechanism according to the present invention, an oscillation element to be oscillated with a predetermined stroke and oscillating means for oscillating the oscillation element at a predetermined frequency are mounted on a stage which is to be positioned. Also, an intermediate structure having a predetermined mass is disposed between the stage and the oscillation element. The intermediate structure, the stage and the oscillation element are coupled by a spring element or elements. The oscillating means is disposed between the intermediate structure and the stage. On the basis of the frequency and amplitude for oscillating the oscillation element, spring constants of two springs and the mass of the intermediate structure are selected appropriately, by which the reactive force to be transmitted to the stage, supporting the oscillation element, can be reduced to zero. This prevents degradation of the positioning precision of the oscillation mechanism, such that high precision oscillation about the position taken by the positioning is attained.

The oscillating frequency of the oscillating means may be made variable continuously, and an oscillating frequency with which vibration to be applied to the stage is made smallest may be selected. The oscillation element may be oscillated with such frequency. Thus, even if there is an error in the mass of any component or in the spring constant of a leaf spring, for example, with respect to a design value, due to a machining error, for example, external disturbance to be applied to the stage can be minimized or be fully avoided.

The oscillating means for the oscillation element may comprise a piezoelectric device. On that occasion, the stage can be made compact and light in weight, and the oscillation element can be oscillated at a higher frequency.

In an exposure apparatus according to the present invention, advantageous effects provided by the positioning mechanism such as described above are also attainable and, additionally, an X-ray mirror can be oscillated at a high speed while being positioned precisely with respect to the SR beam. Thus, uniform SR beam irradiation intensity is attainable upon a mask surface.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the accompanying drawings.

Figure 1:
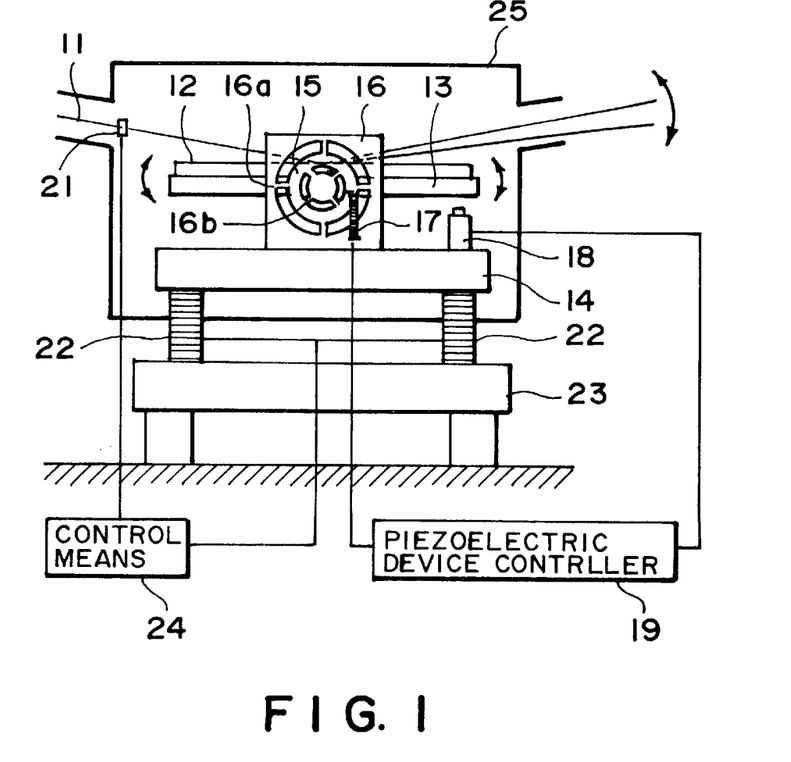
FIG. 1 is a schematic view of the structure of an exposure apparatus having an oscillation mechanism according to the present invention incorporated therein.
Figure 2:
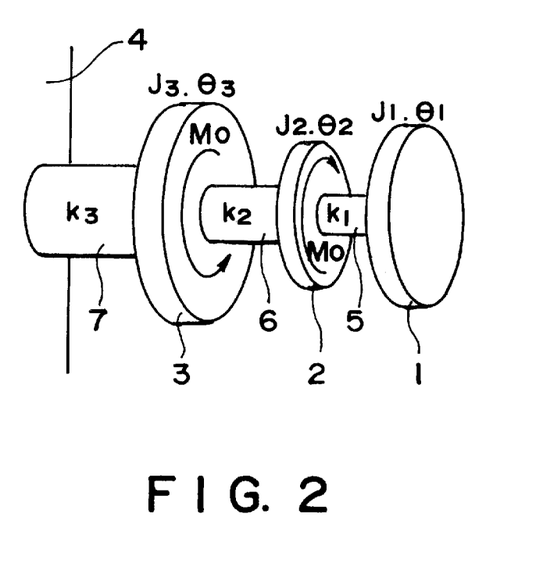
FIG. 2 is a schematic view for explaining the principle of an oscillation mechanism according to the present invention.

FIG. 1 is a schematic view of the structure of an exposure apparatus having an oscillation mechanism according to the present invention incorporated therein. FIG. 2 is a schematic view for explaining the principle of an oscillation mechanism according to the present invention.

Referring first to FIG. 1, the structure of an exposure apparatus according to an embodiment of the present invention will be explained. The exposure apparatus of this embodiment is of the type that, by oscillating an X-ray mirror, an SR beam is substantively expanded to irradiate the whole of a mask surface at once.

In FIG. 1, denoted at 11 is a synchrotron radiation beam (SR beam) emitted from a synchrotron ring, not shown. Denoted at 12 is an X-ray mirror for reflecting the SR beam 11 to irradiate a mask, not shown, and the mirror is held by a holder 13. Denoted at 14 is a stage which provides a reference. Denoted at 15 is an intermediate structure. On the stage 14, the holder 13 of the X-ray mirror 12 is mounted through the intervention of the intermediate structure 15. The stage 14, the intermediate structure 15 and the holder 13 are coupled with each other by means of a metal leaf spring 16 formed by cutting an integral plate-like member. More specifically, the stage 14 and the intermediate structure 15 are coupled with each other by a leaf spring portion 16a having a predetermined spring constant, while the intermediate structure and the holder 13 are coupled with each other by another leaf spring portion 16b having a predetermined spring constant. Further, there is a piezoelectric device 17 as oscillating means, between the stage 14 and the intermediate structure 15. The piezoelectric device 17 is mounted on the stage 14 side to oscillate the intermediate structure 15. More specifically, the intermediate structure 15 is interposed between the stage 14 and the holder 13 for holding the X-ray mirror 12, while the intermediate structure 15, the holder 13 and the stage 14 are coupled by using the metal leaf spring 16 (leaf spring portions 16a and 16b). Also, by using the piezoelectric device 17 mounted on the stage 14 side, the intermediate structure 14 is oscillated, by which the X-ray mirror 12 and the holder 13 thereof are oscillated at a predetermined frequency and amplitude.

Denoted at 18 is a distance measuring unit fixedly mounted on the stage 14, for measuring the amplitude of oscillation of the X-ray mirror 12. Denoted at 19 is a piezoelectric device control unit for controlling the piezoelectric device 17 to produce a predetermined amplitude of the X-ray mirror 12 on the basis of an output of the distance measuring unit 18. The piezoelectric device control unit 19 is operable to continuously change the oscillating frequency of the piezoelectric device 17.

Denoted at 21 is a beam position measuring unit for measuring the position of the SR beam 11. Denoted at 22 is a driving unit supported by a supporting table 23, for adjusting the position and posture of the X-ray mirror 12 through the stage 14. Denoted at 24 is a control unit for controlling the driving unit 22 on the basis of an output of the beam position measuring unit 21, so that the X-ray mirror takes a predetermined position and posture. Denoted at 25 is an ultra-high vacuum chamber for accommodating therein the X-ray mirror 12, the oscillation mechanism for the X-ray mirror, and the like. The inside space thereof is kept at an ultrahigh vacuum.

In the exposure apparatus of the structure described above, the control means 24 controls the driving means 22 on the basis of the result of a measurement made by the beam position measuring means 21, so that a portion of the X-ray mirror 12 about the rotation center thereof is placed at a predetermined position with respect to the SR beam 11. It is to be noted here that, while in this embodiment the position of the SR beam 11 is measured directly, such direct measurement of the SR beam 11 position is not always necessary as long as the positional information is produced in any other method.

Where the SR beam 11 is expanded by the X-ray mirror 12 for irradiating the whole mask surface at once, the X-ray mirror 12 has to be oscillated or vibrated at a high speed to average and make uniform the SR beam intensity projected on the mask surface. To this end, the piezoelectric device 17 fixed to the stage 14 operates to oscillate the intermediate structure 15 thereby to oscillate the X-ray mirror 12 and the holder 13 at a predetermined frequency and amplitude. In this case, by appropriately setting the masses of the stage 14, the intermediate structure 15, the X-ray mirror 12 and the holder 13 for holding the mirror 12 as well as the spring constants of the leaf spring means connecting them, for example, to be described later in detail, substantially no external disturbance to the stage is produced even if the X-ray mirror 12 is oscillated at a high speed. As a result, the X-ray mirror 12 can be placed exactly and stably at a predetermined position with respect to the SR beam 11. Thus, the positioning precision of the X-ray mirror 12 is not degraded.

Next, referring to FIG. 2, the principle of the oscillation mechanism according to the present invention will be described.

In FIG. 2, denoted at 1 is an oscillation element which corresponds to the X-ray mirror 12 and the holder 13 therefor in the exposure apparatus described above. Denoted at 2 is an intermediate structure, corresponding to the intermediate structure 15 of the exposure apparatus described above. Denoted at 3 is a stage to be positioned by use of measuring means, not shown, and this corresponds to the stage 14 of the exposure apparatus described above. Denoted at 4 is a floor on which the stage 3 is supported. Denoted at 5 is a spring for coupling the stage 3 and the floor 4. Denoted at $J_1$, $J_2$ and $J_3$ are inertia moments of the oscillation element 1, the intermediate structure 2 and the stage 3, respectively, which represent angular displacements of the oscillation element 1, the intermediate structure 2 and the stage 3, respectively. Also, denoted at $M_0$ are an oscillating force and a reaction force applied to the intermediate structure 2 and the stage 3, respectively, by oscillating means (not shown) which is disposed between the intermediate structure 2 and the stage 3.

Here, equations of motions for the oscillation element 1, the intermediate structure 2 and the stage 3 are expressed by equations (1), (2) and (3), below, respectively, wherein w is the oscillating frequency:

[Oscillation Element 1]

$$J_1\ddot{\theta}_1 = -k_1(\theta_1 - \theta_2) \tag{1}$$

[Intermediate Structure 2]

$$J_2\ddot{\theta}_2 = k_1(\theta_1 - \theta_2) - k_2(\theta_2 - \theta_3) + M_0\sin(wt) \tag{2}$$

[Stage 3]

$$J_3\ddot{\theta}_3 = k_2(\theta_2 - \theta_3) - k_3\theta_3 - M_0\sin(wt) \tag{3}$$

From the above, the response $\theta_3$ of the stage 3 is given by equation (4) below:

$$\theta_3 = [k_2\theta_2 - M_0\sin(wt)]/[k_2 + k_3 - J_3w^2] \tag{4}$$

In equation (4) above, when $\theta_3$ becomes equal to zero, the stage 3 is not vibrated by external disturbance. Namely, by setting various values so that the numerator of equation (4) becomes equal to zero, vibration of the stage 3 due to external disturbance can be avoided.

Practically, since the oscillating frequency and the amplitude of the oscillation element are predetermined, it is necessary to determine the oscillating force, the spring constant and the inertia moment of the intermediate structure so as to satisfy the predetermined specification. Also, when the oscillation element 1 is oscillated in practice, since there may be certain errors in the mass of a product component or in the spring constant of a leaf spring with respect to their design values, due to any manufacturing errors, for example, there may be cases wherein the external disturbance is not minimized by the design oscillating frequency. In such a case, an acceleration gauge may be mounted on the stage 3 and vibration of them may be measured by using it while changing the oscillating frequency appropriately. A frequency with which the stage vibration becomes smallest may thus be determined, and it may be chosen as the oscillating frequency.

With the structure as shown in FIG. 2 and by setting parameters under the condition for making the response of the stage 3 equal to zero in accordance with the equation of motion, external disturbance to the stage 3 can be prevented when the oscillation element 1 is oscillated at a predetermined frequency and amplitude. As a result, when the oscillation element 1 is placed on the stage 3 through the intermediate structure 2 and it is oscillated while the stage 3 is kept positioned, the external disturbance to the stage can be avoided or reduced to a minimum. The positioning precision of the stage 3 can therefore be kept well and, further, the oscillation element 1 can be oscillated at a high frequency.

Although the above-described embodiment has been explained with reference to a model using a rotational spring for connecting some components, as a matter of course, the external disturbance can be avoided similarly by use of a translational spring.

Referring back to FIG. 1, the exposure apparatus will be explained more. The masses of the stage 14, the intermediate structure 15, the X-ray mirror 12 and the holder 13 therefor as well as the spring constants of the leaf spring portions 16a and 16b, for example, are set so as to satisfy the relations described hereinbefore. With this structure, when the piezoelectric device 17 fixed to the stage 14 oscillates the intermediate structure 15 thereby to vibrate the X-ray mirror 12 and the holder 13 at a high speed, with a predetermined frequency and amplitude, no external disturbance to the stage 14 is produced. Also, if the masses of components or the spring constants of the leaf spring elements are different from their design values due to any manufacturing errors, the piezoelectric device 17 may be controlled by the piezoelectric device control means 19 to continuously change the oscillating frequency, about the predetermined frequency, to determine a frequency with which the external disturbance is applied to the stage becomes smallest. The thus determined frequency may be set as the oscillating frequency and, by doing so, the external disturbance to be applied to the stage 14 can be reduced to a minimum or be fully avoided.

Further, in this embodiment, the vibration amplitude of the X-ray mirror 12 may be measured by using the distance measuring means 18 and, based on it, the output of the piezoelectric device 17 may be controlled by the control means 19 so that the amplitude becomes stably constant.

When the oscillation mechanism according to this embodiment of the present invention is incorporated into an exposure apparatus, of the type that an SR beam is expanded by an X-ray mirror to irradiate the whole mask surface at once, as an oscillation mechanism for the X-ray mirror, the following advantageous results are attainable.

Even if the X-ray mirror is vibrated at a high speed, the X-ray mirror can be positioned stably at a predetermined position with respect to the SR beam. Thus, the X-ray mirror positioning precision is not degraded. As a result of it, the X-ray mirror can be oscillated stably at a high speed, and uniform SR beam irradiation intensity can be provided on the mask surface. Further, even if there is an error in the mass of a component or in the spring constant of a leaf spring element due to any manufacturing error, the external disturbance of the stage can be minimized or fully avoided.

Next, an embodiment of a semiconductor device manufacturing method which uses an exposure apparatus such as described above, will be explained.

Figure 5:
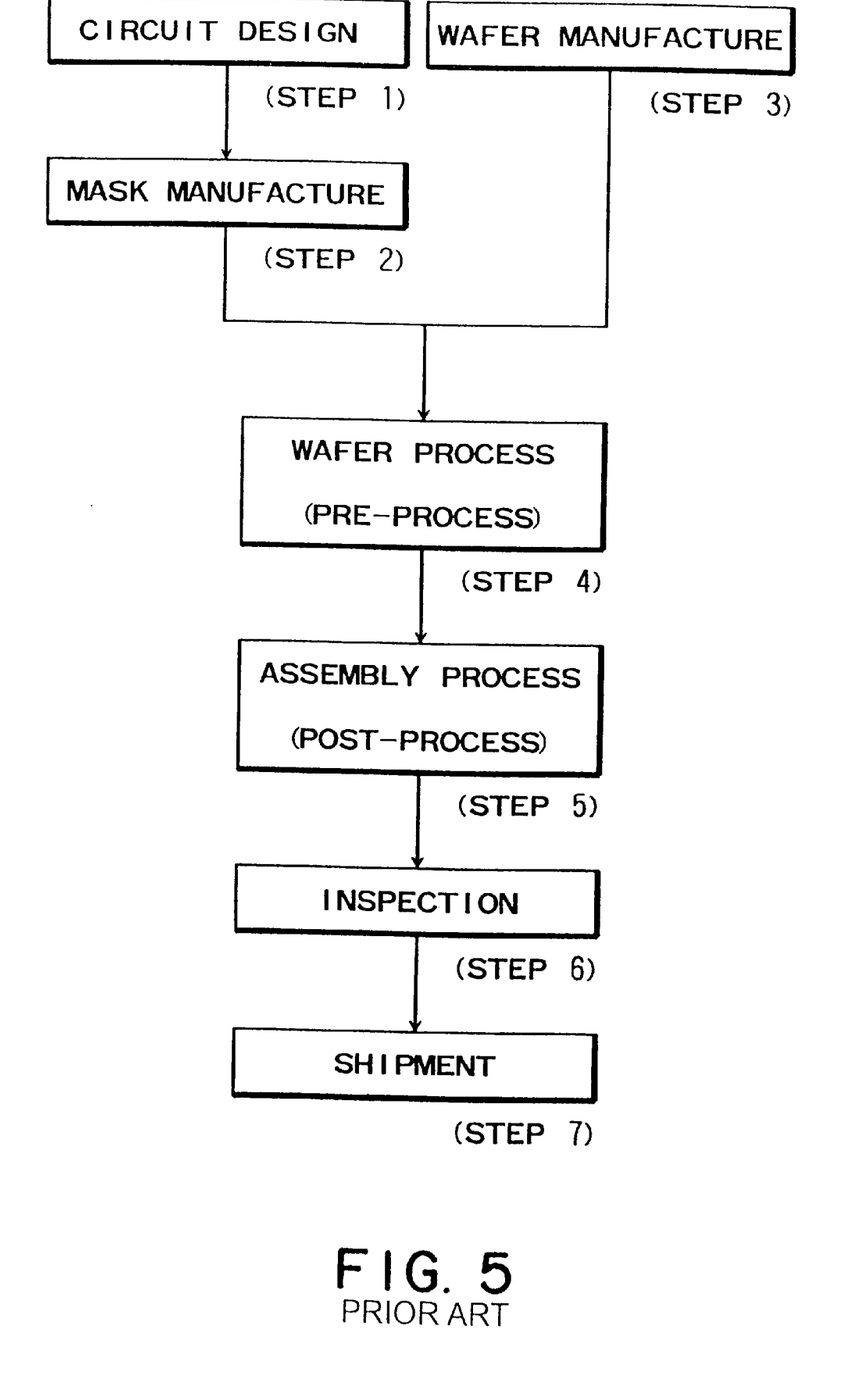
FIG. 5 is a flow chart of semiconductor device manufacturing processes.

FIG. 5 is a flow chart of a procedure for the manufacture of microdevices such as semiconductor chips (e.g., ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 6:
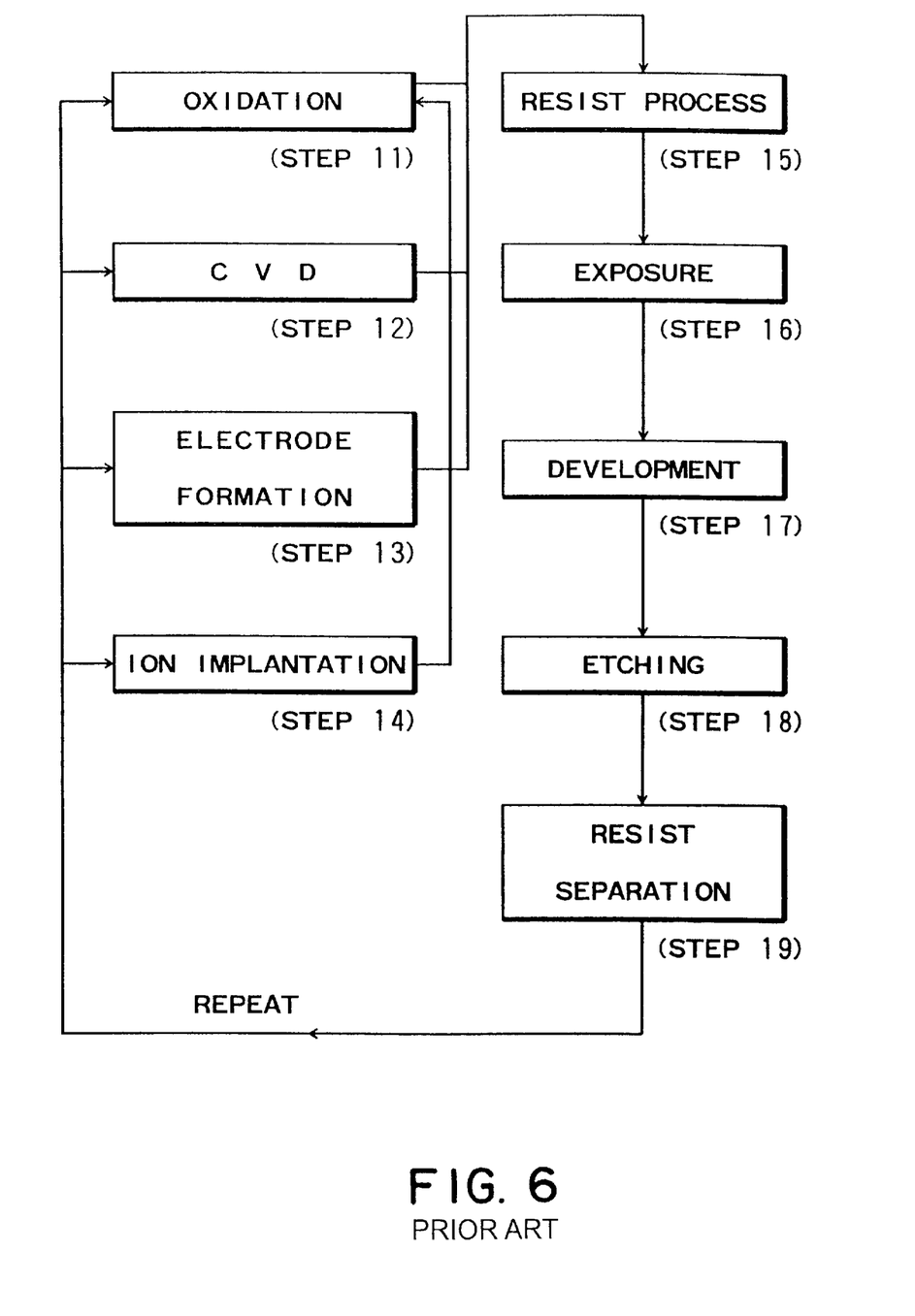
FIG. 6 is a flow chart for explaining details of a wafer process included in the procedure of FIG. 5.

FIG. 6 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured stably with a lower cost.

In accordance with an oscillating mechanism of the present invention, by selecting an appropriate spring constant of spring means as well as an appropriate mass of an intermediate structure on the basis of the frequency and amplitude for oscillation of an oscillation element, a reactive force to be applied to a stage for supporting the oscillation element can be reduced to zero. Also, an oscillating frequency with which external disturbance to be applied to the stage is made minimum can be selected. As a result, the positioning precision of the oscillation mechanism is not degraded, and goodprecision oscillation or vibration at the thus determined position is accomplished.

When a piezoelectric device is used as oscillating means for the oscillation element, the stage can be made small in size and light in weight. Therefore, the oscillation element can be oscillated at a higher frequency.

With an exposure apparatus according to the present invention, advantageous results the same as those of the oscillation mechanism described above are attainable. Additionally, an X-ray mirror can be oscillated at a high speed while the X-ray mirror is kept positioned precisely with respect to an SR beam. Therefore, a uniform SR beam irradiation intensity can be provided upon a mask surface.

While the invention has been described with reference to the structures disclosed herein, it is not confined to the details set forth and this application is intended to cover such modifications or changes as may come within the purposes of the improvements or the scope of the following claims.

What is claimed is:

1. An oscillation mechanism, comprising:

a measuring device for measuring a position of an object;

a movable stage being arranged so as to be positioned with respect to the object;

a driving mechanism for moving said stage;

a control unit for controlling said driving mechanism on the basis of an output of said measuring device;

an oscillation element mounted on said stage and being arranged to be oscillated with respect to said stage;

an intermediate element having a predetermined mass and being disposed between said stage and said oscillation element, wherein said intermediate element is (i) connected to said oscillation element through a first spring element having a predetermined spring constant, and (ii) connected to said stage through a second spring element having a predetermined spring constant; and an oscillation unit for oscillating said oscillation element by oscillating said intermediate element at a predetermined frequency.

2. An oscillation mechanism according to claim 1, wherein said oscillating unit is operable to change the oscillating frequency continuously.

3. An oscillation mechanism according to claim 1, wherein the oscillating frequency of said oscillating unit is changed continuously to determine an oscillating frequency with which vibration to be applied to said stage is minimized.

4. An oscillation mechanism according to claim 1, wherein said oscillating unit includes a piezoelectric device.

5. An exposure apparatus, comprising:

a light source;

a measuring device for measuring a beam from said light source;

a movable stage being arranged so as to be positioned with respect to the beam;

a driving mechanism for moving said stage;

a control unit for controlling said driving mechanism on the basis of an output of said measuring device;

an oscillation element mounted on said stage and being arranged to be oscillated with respect to said stage, said oscillation element holding an optical element;

an intermediate element having a predetermined mass and being disposed between said stage and said oscillation element, wherein said intermediate element is (i) connected to said oscillation element through a first spring element having a predetermined spring constant, and (ii) connected to said stage through a second spring element having a predetermined spring constant; and an oscillating unit for oscillating said oscillation element by oscillating said intermediate element at a predetermined frequency.

6. An apparatus according to claim 5, wherein said light source comprises a synchrotron radiation light source.

7. An apparatus according to claim 5, wherein said optical element comprises a mirror.

8. An apparatus according to claim 5, wherein said oscillating unit is operable to change the oscillating frequency continuously.

9. An apparatus according to claim 5, wherein the oscillating frequency of said oscillating unit is changed continuously to determine an oscillating frequency with which vibration to be applied to said stage is minimized.

10. An apparatus according to claim 5, wherein said oscillating unit includes a piezoelectric device.

11. A device manufacturing method, comprising the steps of:

applying a photosensitive material to a wafer;

exposing the wafer by use of an exposure apparatus as recited in claim 5; and developing the exposed wafer.

12. An oscillation mechanism, comprising:

a stage;

an oscillation element mounted on said stage and being arranged to be oscillated with respect to said stage;

an intermediate element having a predetermined mass and being disposed between said oscillation element and said stage, wherein said intermediate element is connected to said oscillation element through a first spring element having a predetermined spring constant and said intermediate element is connected to said stage through a second spring element having a predetermined spring constant; and an oscillating unit for oscillating said oscillation element by oscillating said intermediate element at a predetermined frequency.

13. An exposure apparatus, comprising:

a stage;

an oscillation element mounted on said stage and being arranged to be oscillated with respect to said stage;

an intermediate element having a predetermined mass and being disposed between said oscillation element and said stage, wherein said intermediate element is connected to said oscillation element through a first spring element having a predetermined spring constant and said intermediate element is connected to said stage through a second spring element having a predetermined spring constant; and an oscillation unit for oscillating said oscillation element by oscillating said intermediate element at a predetermined frequency.

14. An exposure apparatus, comprising:

a light source;

a stage;

an oscillation element mounted on said stage and being arranged to be oscillated with respect to said stage, said oscillation element holding an optical element to deflect a light beam from said light source;

an intermediate element having a predetermined mass and being disposed between said oscillation element and said stage, wherein said intermediate element is connected to said oscillation element through a first spring element having a predetermined spring constant and said intermediate element is connected to said stage through a second spring element having a predetermined spring constant; and an oscillating unit for oscillating said oscillation element by oscillating said intermediate element at a predetermined frequency.

* * * * *

UNITED STATES PATENT AND TRADEMARK OFFICE
CERTIFICATE OF CORRECTION

PATENT NO.     : 6,618,146 B1
DATED          : September 9, 2003
INVENTOR(S)    : Takayuki Hasegawa It is certified that error appears in the above-identified patent and that said Letters Patent is hereby corrected as shown below:

Title page,
Item [*] Notice, "0 days." should read -- 233 days. --

Drawings,
Figure 1, above lead line 19, "CONTRLLER" should read -- CONTROLLER --.
Line 19, "stoke," should read -- stroke, --.

Column 1,
Line 40, "ring, not shown." should read -- ring (not shown). --

Column 2,
Line 14, "cause" should read -- causes --.

Column 4,
Line 59, "ring, not shown." should read -- ring (not shown). --
Line 61, "mask, not shown," should read -- mask (not shown), --

Column 6,
Line 13, "$J_2\ddot{\theta}_2 - k_1(\theta_1 - \theta_2) - k_2(\theta_2 - \theta_3) + M_O \sin(wt)$" "means, not shown," should read -- $J_2\ddot{\theta}_2 = k_1(\theta_1 - \theta_2) - k_2(\theta_2 - \theta_3) + M_O \sin(wt)$ -- means (not shown), -- Line 36, should read Column 7,
Line 20, "more." should read -- further. --.
Line 36, "is" should be deleted.

UNITED STATES PATENT AND TRADEMARK OFFICE
CERTIFICATE OF CORRECTION

PATENT NO.    : 6,618,146 B1
DATED         : September 9, 2003
INVENTOR(S)   : Takayuki Hasegawa It is certified that error appears in the above-identified patent and that said Letters Patent is hereby corrected as shown below:

<u>Column 8,</u>
Line 49, "goodprecision" should read -- good-precision --.

Signed and Sealed this

Twenty-fourth Day of August, 2004

JON W. DUDAS
*Director of the United States Patent and Trademark Office*